United States Patent
Kim et al.

(10) Patent No.: US 7,193,466 B2
(45) Date of Patent: *Mar. 20, 2007

(54) OPERATIONAL TRANSCONDUCTANCE AMPLIFIER WITH DC OFFSET ELIMINATION AND LOW MISMATCH

(75) Inventors: Young Ho Kim, Daejeon (KR); Mun Yang Park, Daejeon (KR)

(73) Assignee: Electronics And Telecommunications Research Institute (KR)

( * ) Notice: Subject to any disclaimer, the term of this patent is extended or adjusted under 35 U.S.C. 154(b) by 142 days.

This patent is subject to a terminal disclaimer.

(21) Appl. No.: 11/019,765

(22) Filed: Dec. 20, 2004

(65) Prior Publication Data

US 2005/0140445 A1 Jun. 30, 2005

(30) Foreign Application Priority Data

Dec. 26, 2003 (KR) .................. 10-2003-0097756

(51) Int. Cl.
*H03F 3/45* (2006.01)
(52) U.S. Cl. .................. 330/258; 330/253; 330/260
(58) Field of Classification Search ................ 330/258, 330/253, 260
See application file for complete search history.

(56) References Cited

U.S. PATENT DOCUMENTS

| | | | | |
|---|---|---|---|---|
| 5,436,594 | A | * 7/1995 | Pace et al. | .................. 330/258 |
| 5,726,597 | A | * 3/1998 | Petty et al. | .................. 327/307 |
| 6,064,262 | A | * 5/2000 | Wang | .................. 330/253 |
| 6,566,951 | B1 | 5/2003 | Merrigan et al. | |
| 6,636,098 | B1 | * 10/2003 | Kizer | .................. 327/345 |
| 6,657,488 | B1 | 12/2003 | King et al. | |
| 6,750,704 | B1 | * 6/2004 | Connell et al. | .................. 330/9 |

FOREIGN PATENT DOCUMENTS

| | | |
|---|---|---|
| KR | 94002967 B1 | 4/1994 |
| KR | 00213240 B1 | 5/1999 |
| KR | 000035417 A | 6/2000 |

OTHER PUBLICATIONS

DC Offset Canceller in a Direct Conversion Receiver for QPSK Signal Reception, pp. 1314-1318.
A Low Voltage Operational Transconductance Amplifier suing common Mode Feedforward for High Frequency Switched Capacitor Circuits, pp. 643-646.
Design Considerations for Common-Mode Feedback Circuits in Fully-Differential Operational Transconductance Amplifiers with Tuning, pp. 1363-1366.

* cited by examiner

*Primary Examiner*—Patricia Nguyen
(74) *Attorney, Agent, or Firm*—Blakely Sokoloff Taylor & Zafman

(57) ABSTRACT

Provided is a transconductor capable of eliminating a direct current (DC) offset component of a signal and compensating a mismatch of the signal. The transconductor includes amplifiers of simple circuit structures, and a common mode control DC offset elimination circuit. The transconductor includes a common mode control DC offset elimination circuit unit receiving input/output voltages to stabilize the current supplying and the output DC value, a first amplifier and a second amplifier reducing a mismatch in a transconductor circuit and increasing an output resistance, in order to prevent a signal distortion or a wrong operation of the circuit that is caused by the mismatch signal and unstable DC voltage.

9 Claims, 6 Drawing Sheets

OPERATIONAL TRANSCONDUCTANCE AMPLIFIER WITH DC OFFSET ELIMINATION AND LOW MISMATCH

BACKGROUND OF THE INVENTION

This application claims the priority of Korean Patent Application No. 2003-97756, filed on Dec. 26, 2003, in the Korean Intellectual Property Office, the disclosure of which is incorporated herein in its entirety by reference.

1. Field of the Invention

The present invention relates to a transconductor, and more particularly, to a transconductor, of which direct current (CD) offset component is cancelled and a mismatch characteristic is improved.

2. Description of the Related Art

An operational transconductance amplifier (OTA) is a current amplifier that amplifies an applied input voltage and outputs the input voltage as an output voltage in proportion to a transconductance (Gm). In a case where the OTA is applied in a communication system of direct conversion type, a signal of high frequency is converted into baseband signal based on a direct current (DC), and a DC offset largely affects the performances of the system. The DC offset degrades a restoration function of the signal, and causes a wrong operation of the system since it makes an operational point of next stage be a saturation status. Generally, the DC offset may be generated by frequency conversion that is caused by a local oscillator (LO) signal leakage or an interferer leakage such as a time-variant DC-offset, or generated by a non-linear mixer or an asymmetric circuit such as a time-invariant DC-offset.

A low pass filter that is located at a rear end of a receive system in the entire system is largely affected by the DC-offset. Therefore, in order to satisfy a desired bit error ratio (BER), the DC-offset should be eliminated and a clean signal should be transmitted to a final analog/digital converter (ADC). Especially, in a case where the low pass filter is formed of active circuits of the OTA and a capacitor, each of OTA cells should have a performance of eliminating the DC offset so that a DC value of respective node does not become the saturation status, but maintains at a predetermined voltage value even when the DC offset is generated at the previous node.

In a differential circuit structure, a mismatch characteristic may make a signal non-linear, and generate an internal DC offset. Thus, the DC value of output signal can be differentiated, and accordingly, the mismatch of the signal at the next node becomes worse. Therefore, the BER of the entire system may be degraded.

In a superheterodyne system that is conventionally used, the DC offset is small, thus there is no need to use a filter eliminating the DC offset. However, in the direct conversion system for realizing a system on chip (SOC) of lower power consumption, a circuit design for solving the DC offset problem is required.

FIG. 1 is a circuit diagram showing a conventional triode-typed transconductor. In addition, FIG. 2 is a circuit diagram showing a common mode control circuit of FIG. 1 in detail.

Referring to FIG. 1, the conventional transconductor includes triode-typed transconductors M1$a$, M1$b$, M1$c$, and M1$d$ having a dual-pair input vpi1, vmi1, vpi2, and vmi2 structure, and a gain boosting amplifier. The gain boosting amplifier includes transistors M2$a$ and M2$b$, and an amplifier A1. Transistors M3$a$, M3$b$, M4$a$, and M4$b$ are loads to supply predetermined electric currents, and an amplifier A2 increases output resistance in connection with the transistors M3$a$ and M3$b$. In addition, an amplifier Am that is a common mode control circuit compares a constant output voltage and a sub-output voltage to a common mode voltage Vcm to control the electric currents of the transconductors M1$a$, M1$b$, M1$c$, and M1$d$ through the transistors M4$a$ and M4$b$ so that the two output voltages are corresponded to the common mode voltage Vcm.

Referring to FIG. 2, the amplifier Acm, that is, the common mode control circuit includes transistors M100, M101, M102, M103, M104, M105, M106, M107, and M108. The transistors M100 and M101 generate electric current of a predetermined magnitude by mirroring a current source of a bias circuit. The transistors M102 and M103 and the transistors M104 and M105 form differential pair amplifiers, respectively. The transistors M106 and M108 perform as loads. The transistor M107 includes a diode connection to transmit the current generated by the transistors M100 and M101 and supply the fixed current to a core of the transconductor. Two output voltages vo+ and vo− of the transconductor are compared to the common mode voltage Vcm through two differential pair amplifiers M102 and M103, and M104 and M105, respectively. The differences of compared voltages is amplified and added to form a gate voltage VMFB of the transistor M107. The gate voltage CMFB is a DC component value without an alternating current (AC) component, and the DC component value is inverted and amplified through the transistors M4$a$ and M4$b$ shown in FIG. 1 so that the output DC value can be corresponded to the common mode voltage Vcm.

However, in the above case, although the output voltage can be maintained constantly, the DC offset generated in the input voltages vpi1, vmi1, vpi2, and vmi2 cannot be eliminated. In addition, in a case where a mismatch in the output voltage is generated due to a change of device size after performing processes, the mismatch cannot be eliminated. Since the filter generally has a structure, in which a plurality of transconductors are connected in parallel and serial to each other, if the output DC voltage of first transconductor, that is, the input DC value of the next transconductor, is not coincided with the output DC voltage of the next transconductor, the filter performs a wrong operation and makes the next circuit saturated.

SUMMARY OF THE INVENTION

The present invention provides an operational transconductance amplifier (OTA) capable of eliminating an input DC offset and compensating a mismatch of a signal so that an output DC value can be fixed with maintaining a linear range and a large output resistance value of a conventional transconductor.

According to an aspect of the present invention, there is provided a transconductor including a common mode control DC offset elimination circuit receiving input/output voltages to stabilize current supplying and output DC value constantly, and a first differential amplifier and a second differential amplifier reducing a mismatch in a transconductor circuit and increasing an output resistance in order to prevent a DC voltage applied to input/output nodes from being saturated or a circuit from wrongly operating due to a DC offset or a mismatch of the circuit.

BRIEF DESCRIPTION OF THE DRAWINGS

The above and other features and advantages of the present invention will become more apparent by describing in detail exemplary embodiments thereof with reference to the attached drawings in which.

DETAILED DESCRIPTION OF THE INVENTION

Figure 3:
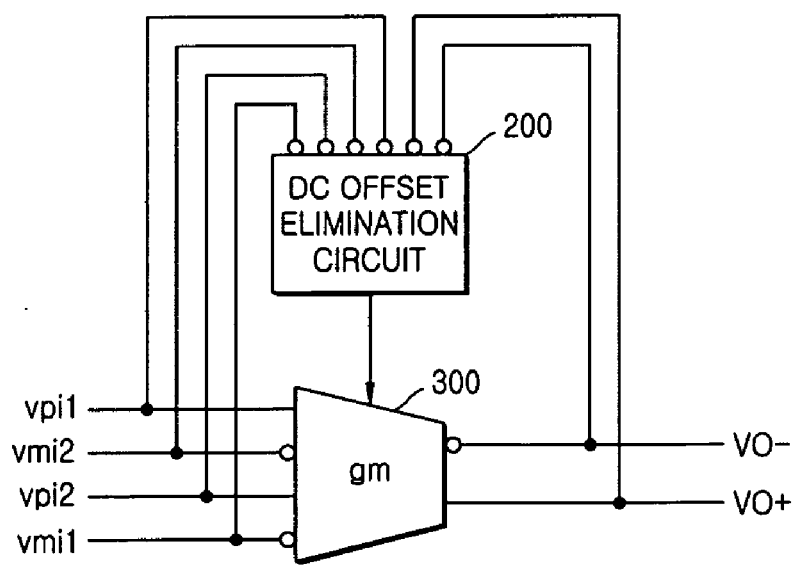
FIG. 3 is a view showing a transconductor according to the present invention.

FIG. 3 is a circuit diagram showing a transconductor according to the present invention.

Referring to FIG. 3, the transconductor of the present invention includes a transconductor circuit 300 and a direct current (DC) offset elimination circuit 400. The transconductor circuit 300 converts input voltages vpi1, vmi1, vpi2, and vmi2 so that the input voltages are in proportion to a transconductance gm, and outputs output voltages vo+ and vo−. The DC offset elimination circuit 400 receives the dual-pair inputs vpi1, vmi1, vpi2, and vmi2, the constant output vo+, and the sub-output vo− to generate DC offset elimination voltage. The DC offset elimination voltage is input into the transconductor circuit 300 so that the affects of the DC offset in the transconductor circuit 300 can be eliminated.

Figure 4:
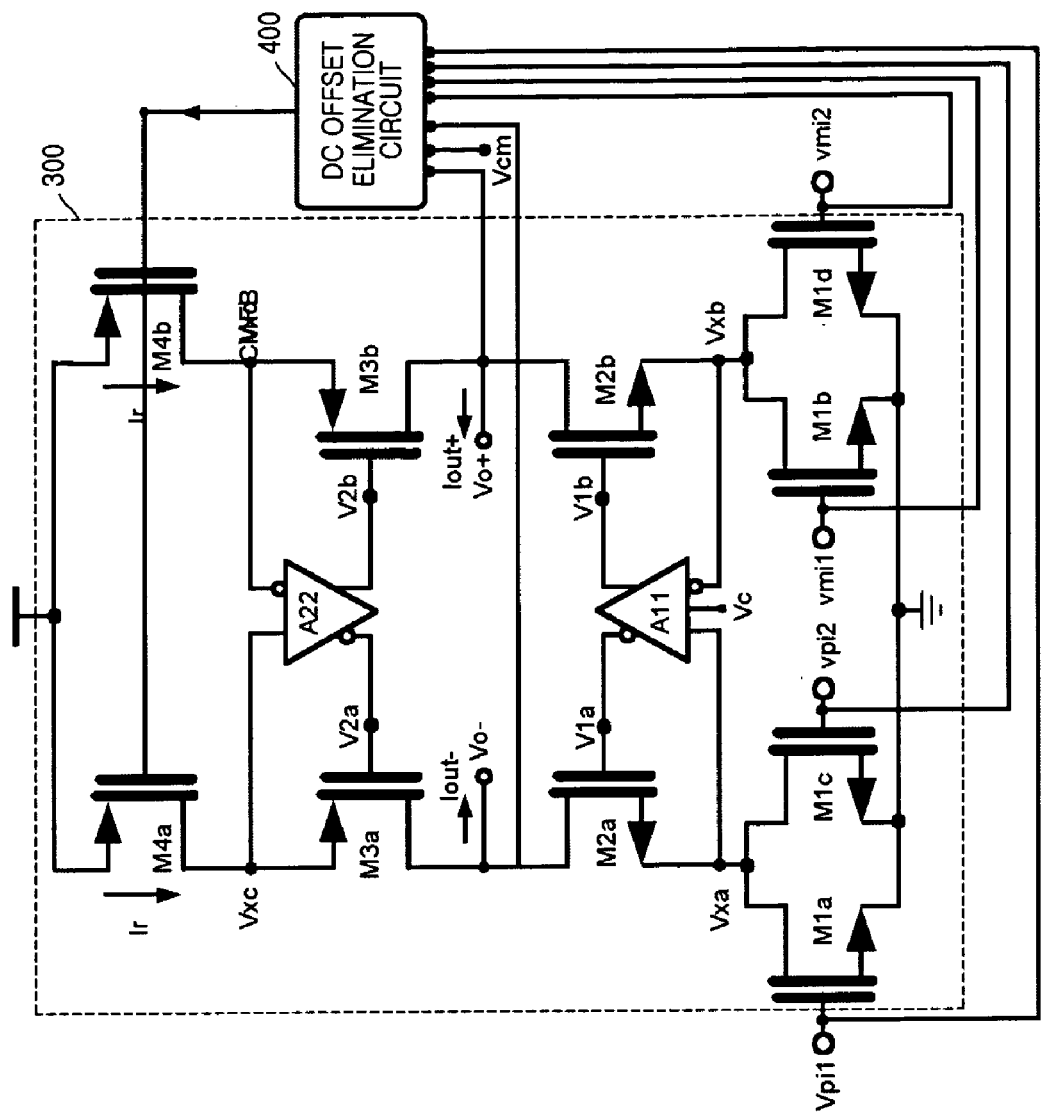
FIG. 4 is a circuit diagram showing the transconductor of FIG. 3 in more detail.

FIG. 4 is a circuit diagram showing the transconductor of FIG. 3 in more detail.

Referring to FIG. 4, the transconductor circuit 300 of FIG. 3 includes input transistors M1a, M1b, M1c, and M1d having dual-pair vpi1, vmi1, vpi2, and vmi2 input structures. The input transistors M1a, M1b, M1c, and M1d are n-channel type MOS transistors. The transistors M2a and M2b and a first inversion amplifier A11 receive core node voltages Vxa and Vxb of the input transistors M1a, M1b, M1c, and M1d and control drain-source voltages of the input transistors M1a, M1b, M1c, and M1d so as to be changed as a function of a predetermined transconductance changing voltage Vc, so that the input transistors M1a, M1b, M1c, and M1d can operate in the triode region. Transistors M2a and M2b are n-channel MOS transistors. Transistors M3a and M3b, and a second inversion amplifier A22 increase an output resistance. Transistors M4a and M4b supplies the electric current input from the DC offset elimination circuit 400 by mirroring the current. The transistors M3a, M3b, M4a, and M4b are p-channel MOS transistors.

Figure 5:
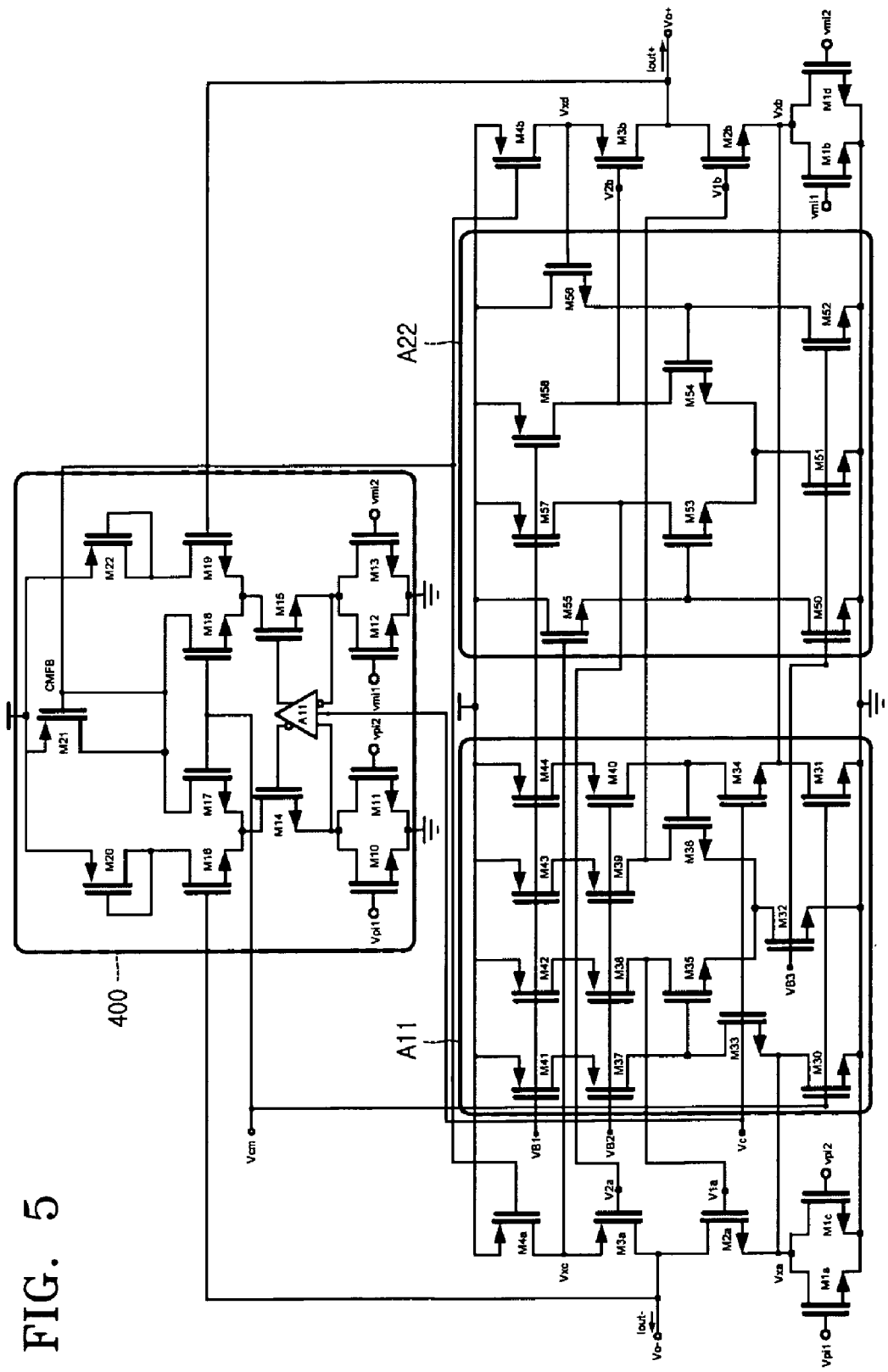
FIG. 5 is a circuit diagram showing internal circuit of a DC offset elimination circuit and internal circuits of an inversion amplifier of the transconductor circuit in the transconductor of FIG. 3.
Figure 7:
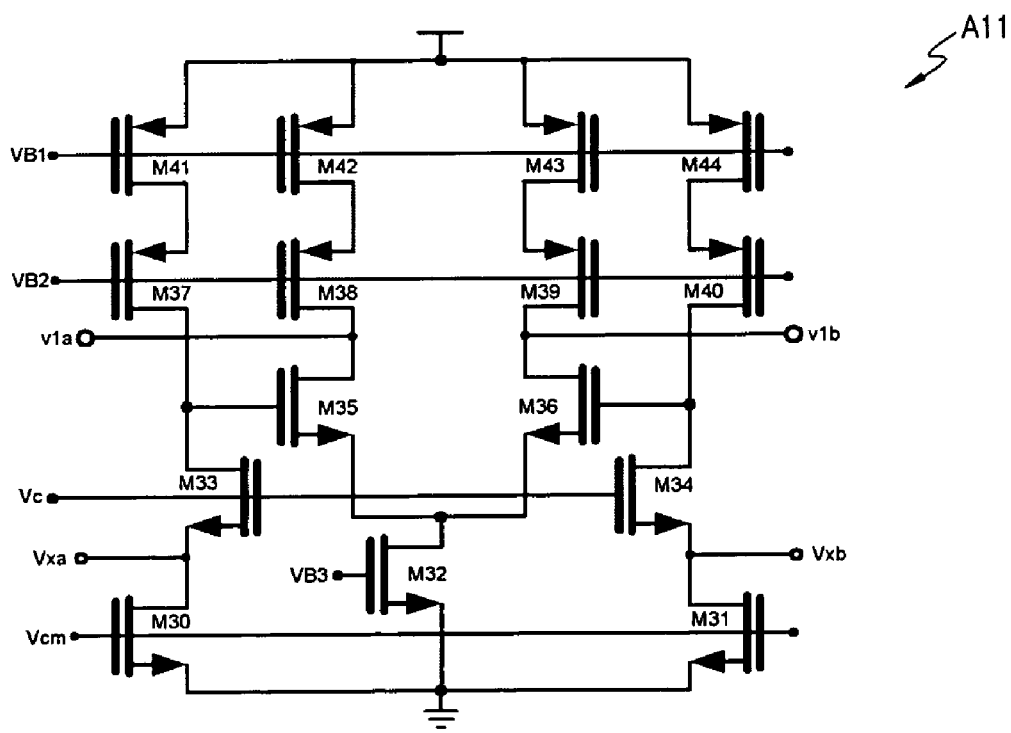
FIG. 7 is a circuit diagram showing a first inversion amplifier shown in FIG. 5 in detail.
Figure 8:
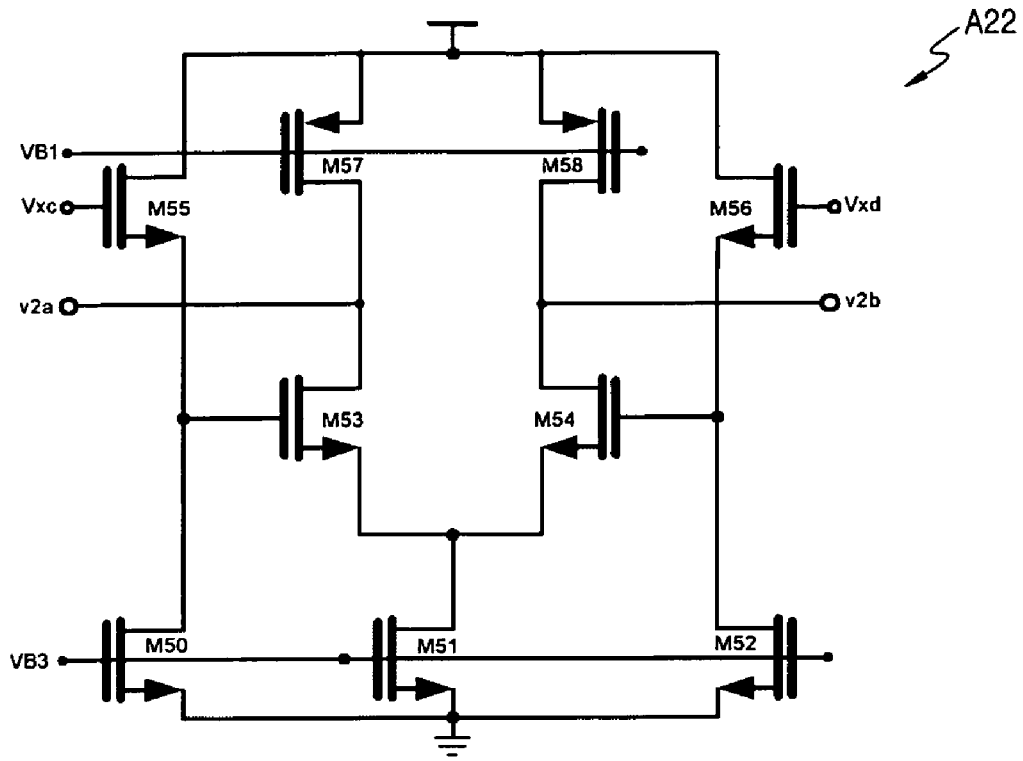
FIG. 8 is a circuit diagrams showing a second inversion amplifier shown in FIG. 5 in detail.

FIG. 5 is a circuit diagram showing an internal circuit of the DC offset elimination circuit and internal circuits of the inversion amplifiers of the transconductor circuit. In addition, FIGS. 6 through 8 are circuit diagrams showing the DC offset elimination circuit 400, the first inversion amplifier A11, and the second inversion amplifier A22 of FIG. 5, respectively.

Figure 6:
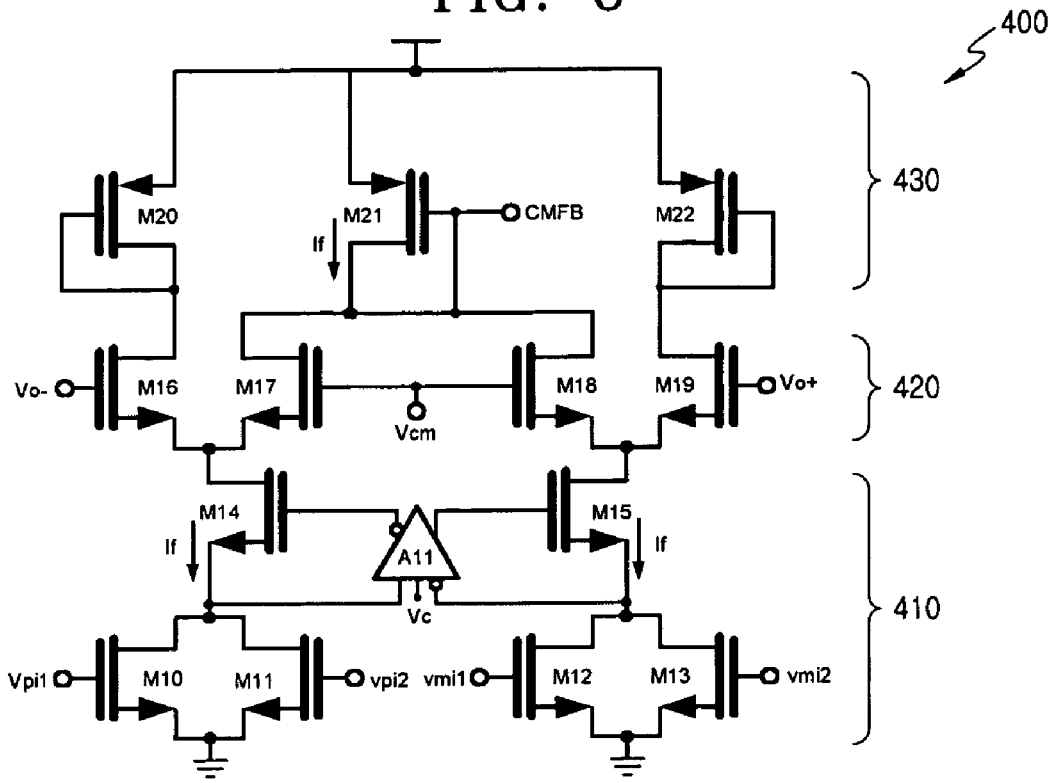
FIG. 6 is a circuit diagram showing the DC offset elimination circuit shown in FIG. 5 in detail.

Referring to FIG. 6, the DC offset elimination circuit 400 includes a current generation circuit 410 having transistors M10, M11, M12, M13, M14, and M15 and the amplifier A11, a common mode feedback circuit 420 having two differential amplifiers M16 and M17, and M18 and M19, and a load circuit 430 including transistors M20, M21, and M22. Especially, the transistor M21 performs a function of current mirror.

The current generation circuit 410 generates the current If flowing on the transconductor circuit 300. The transistors M10, M11, M12, and M13 operate in the triode region, and receive the dual-pair input voltages vpi1, vmi1, vpi2, and vmi2 with the transconductor circuit 300 and generate common current If corresponding to the input voltages vpi1, vmi1, vpi2, and vmi2. That is, the common current If is a function of the input voltages vpi1, vmi1, vpi2, and vmi2. In order for the transistors M10, M11, M12, and M13 to operate in the triode region, the transistors M14 and M15 and the amplifier A11 maintain the drain-source voltage Vds of the transistors M10, M11, M12, and M13 to be smaller than a difference between the gate-source voltage and a threshold voltage ($V_{GS}$–Vth) like the transistors M2a and M2b (refer to FIG. 4) and the amplifier A11 (refer to FIG. 4). The differential amplifiers M16 and M17, and M18 and M19 of the common mode feedback circuit 420 receive two output voltages and common mode voltage (vo− and Vcm), and (vo+ and Vcm) respectively to stabilize the output voltages vo+ and vo−.

Figure 1:
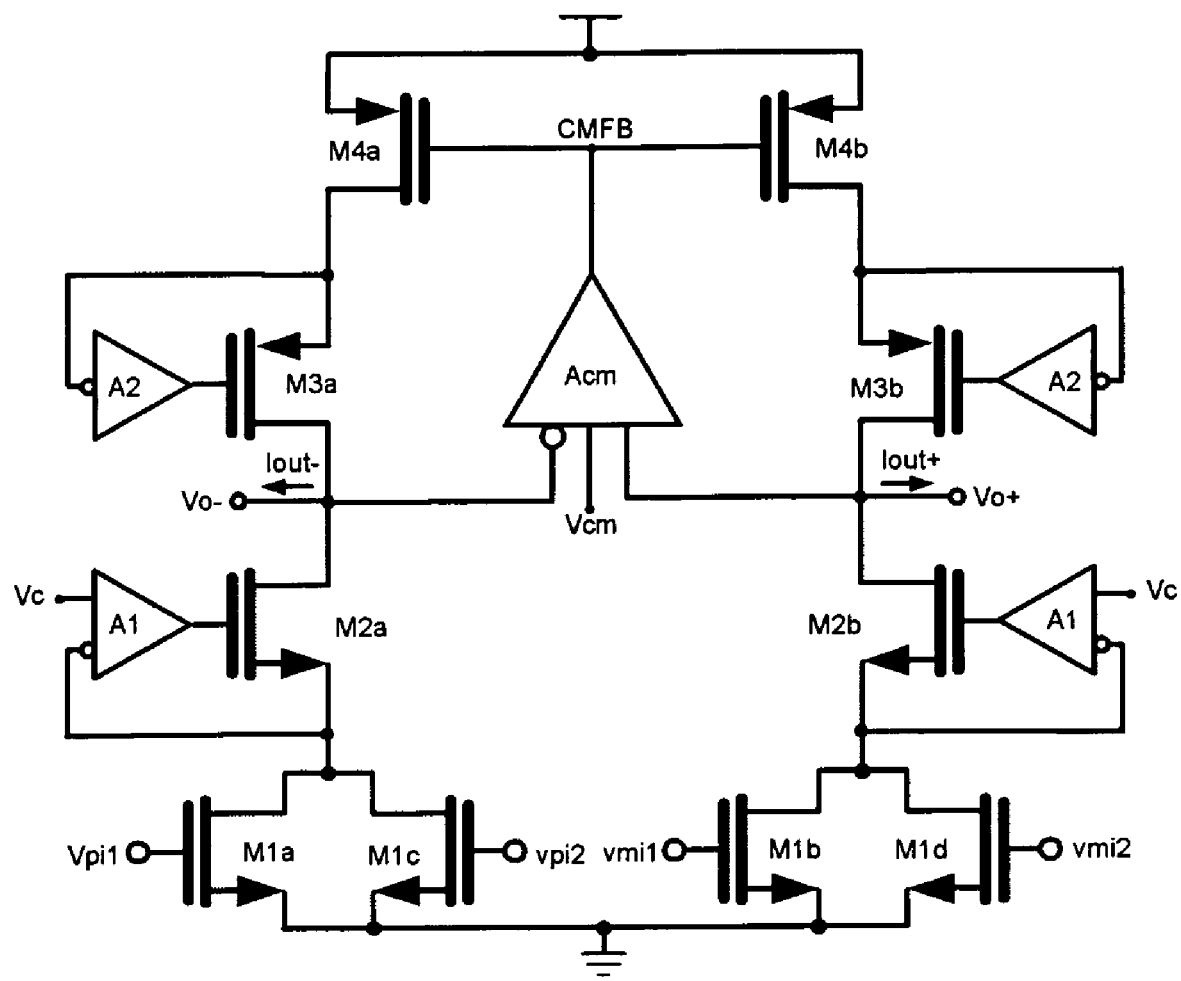
FIG. 1 is a circuit diagram showing a conventional triode-typed transconductor.
Figure 2:
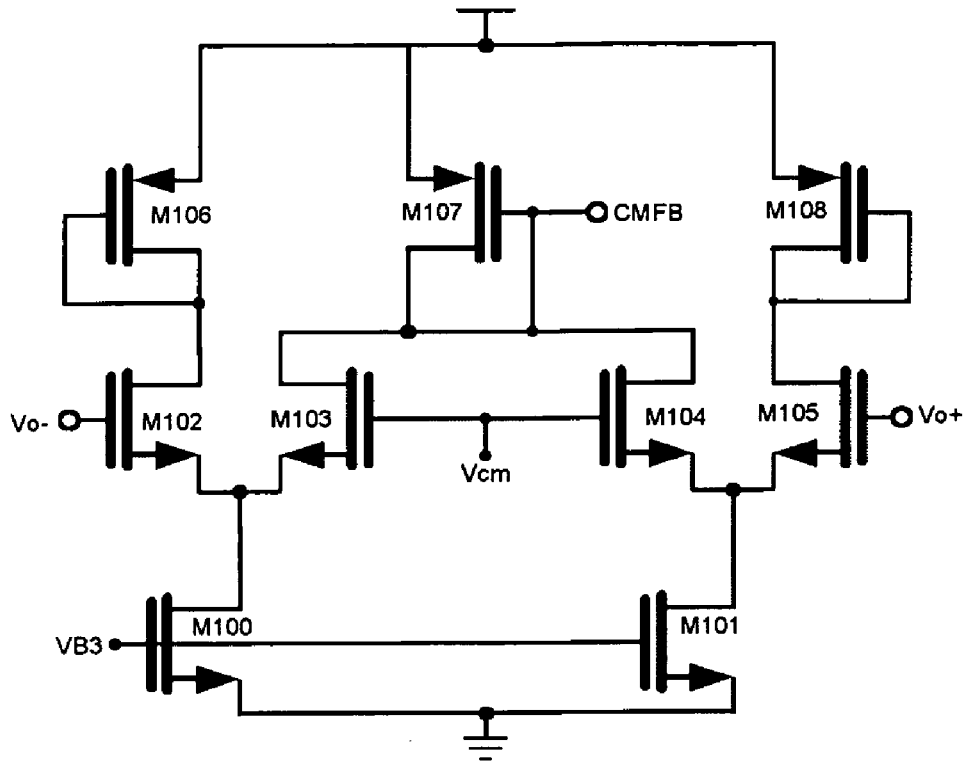
FIG. 2 is a circuit diagram showing a common mode control circuit shown in FIG. 1 in detail.

The transistors M4a and M4b generate the current flowing on the transconductor circuit 300 by mirroring the current If flowing on the transistor M21. Here, the current flowing on the CD offset elimination circuit should be lowered in a current ratio of 10 times lower than the current If so that the transistors M3a and M3b are not exceed from a saturated region. Therefore, a ratio between areas of the transistors M3a and M3b and the transistor M21 is the same as the current ratio. In the conventional art, the current flowing on the common mode control circuit Acm shown in FIG. 2 is a constant current controlled by a bias circuit, however, the current generated by the DC offset elimination circuit 400 is changed according to the input voltages. Accordingly, the DC offset elimination circuit 400 controls the output voltages vo+ and vo− of the transconductor circuit (300 in FIG. 4) so as to be coincided with the common mode voltage Vcm by comparing the output voltages to the common mode voltage Vcm like in the conventional art, however, the DC offset elimination circuit 400 of the present invention makes the current that is changed according to the input voltages flow on the transconductor circuit, thus the DC values of the output voltages vo+ and vo− can be coincided with the common mode voltage Vcm even if the DC offset is generated.

Referring to FIG. 7, the first inversion amplifier A11 receive drain voltages of the input transistors M1a, M1b, M1c, and M1d to make the input transistors M1a, M1b, M1c, and M1d operate in the triode region. The first inversion amplifier A11 includes transistors M30 and M31 performing as resistances and current paths, a transistor M32 as a current source, transistors M33, M34, M35, and M36 forming the inversion amplifier, and load transistors M37, M38, M39, M40, M41, M42, M43, and M44.

The transistors M30, M31, M32, M33, M34, M35, and M36 are n-channel type MOS transistors, and the transistors M37, M38, M39, M40, M41, M42, M43, and M44 are p-channel type MOS transistors. The transistors M30 and M31 operate in the triode region, and the transistors M33 and M34 receive node voltages sharing the node with the drains of the transistors M30 and M31. The transistors M35 and M36 receive the signal that is input into the sources of the transistors M33 and M34 and amplified at the common gate through the gate thereof. In addition, the signal that is inversely amplified by the transistors M35 and M36 is applied to the gate of the transistors M2a and M2b (refer to FIG. 4).

The transistors M33, M34, M35, and M36 output the output voltages V1a and V1b that are made by amplifying the input voltages Vxa and Vxb thereto. The first inversion amplifier A11 controls the drain-source voltages of the transistors into the function of the transconductance changing voltage Vc in combination with the transistors M2a and M2b of FIG. 4 or the transistors M14 and M15 of FIG. 6 so that the input transistors M1a, M1b, M1c, and M1d of FIG. 4 or the transistors M10, M11, M12, and M13 of FIG. 6 can operate in the triode region. Here, the transconductance changing voltage Vc is the DC voltage that increases/reduces the transconductance value gm of the transconductor proportionally, and is supplied from an external tuning circuit. As described above, when the amplifier A11 is used, the circuit operation is not affected by the low values of the input voltages Vxa and Vxb, and the mismatch between the input voltages Vxa and Vxb caused by the change of areas after the processes can be compensated by differentially amplifying the input voltages Vxa and Vxb of both nodes in the transconductor circuit 300.

Referring to FIG. 8, the second inversion amplifier A22 increases the output resistance in combination with the transistors M3a and M3b of the transconductor circuit 300. The second inversion amplifier A22 includes transistors M50, M51, and M52 as current sources, transistors M53, M54, M55, and M56 forming the differential amplifiers, and load transistors M57 and M58. The transistor pairs M55 and M53, and M56 and M54 are formed of source follower circuits, and accordingly, the transistors M55 and M56 buffer the drain voltages of the transistors M4a and M4b in the transconductor circuit 300 from the gate to the source, and the transistors M53 and M54 differentially amplify the buffered voltages and transmit the amplified voltages to the gates of the transistors M3a and M3b in the transconductor circuit 300. Since the second inversion amplifier A22 also has the differential structure receiving the input voltages Vxa and Vxb at the both nodes of the transconductor circuit 300 like the first inversion amplifier A11, the mismatch can be compensated. In addition, the transistors M50, M51, M52, M53, M54, M55, and M56 are the n-channel type MOS transistors, and the transistors M57 and M58 are p-channel type MOS transistors.

Figure 9:
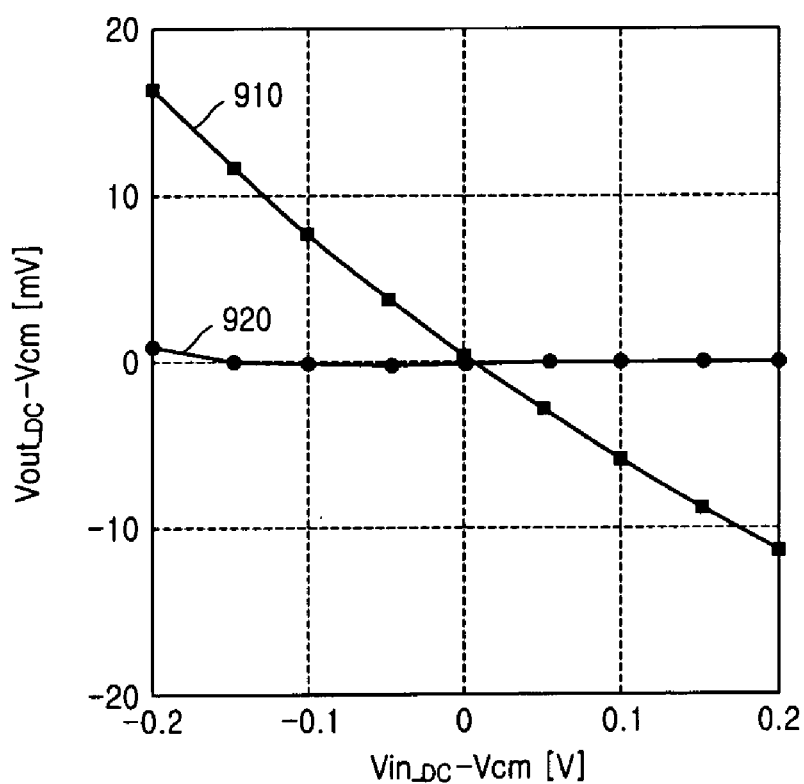
FIG. 9 is a graph showing a change of output voltages according to the DC offset in the transconductor according to the present invention.

FIG. 9 is a graph showing a change of output voltage according to the DC offset in the transconductor according to the present invention.

As shown in FIG. 9, according to the conventional transconductor without the DC offset elimination circuit (the line denoted by reference numeral 910 in FIG. 9), the output voltage is rapidly changed due to the DC offset, however, according to the transconductor of the present invention (the line denoted by reference numeral 920 in FIG. 9), the constant output voltage can be maintained even when the DC offset is generated, and accordingly, it can be recognized that the DC offset is eliminated by the DC offset circuit.

As described above, in the transconductor according to the present invention, the mismatch output voltage and the DC offset voltage/current can be eliminated at low voltage environment while maintaining the linear range and larger output resistance value using a simple circuit configuration, thus the voltages of respective nodes can be stabilized in a case where a plurality of transconductors are connected in parallel/serial such as a filter, and accordingly, the stability of the entire communication system.

While the present invention has been particularly shown and described with reference to exemplary embodiments thereof, it will be understood by those of ordinary skill in the art that various changes in form and details may be made therein without departing from the spirit and scope of the present invention as defined by the following claims.

What is claimed is:

1. A transconductor comprising:
   a transconductor circuit outputting an output voltage that is converted from an input voltage so as to be in proportion to a transconductance; and
   a direct current (DC) offset elimination circuit fixing an output DC voltage, which is changed according to a DC offset included in the input voltage, into a common mode voltage of constant magnitude,
   wherein the transconductor circuit including:
      a first transistor having a dual-pair input structure and operating in a triode region;
      a second transistor receiving a node voltage of the first transistor and controlling a drain-source voltage of the first transistor so that the first transistor can operate in the triode region and a first inversion amplifier,
      a third transistor and a second inversion amplifier disposed to increase an output resistance; and
      a fourth transistor supplying the electric current that is input from the DC offset elimination circuit by mirroring the current.

2. The transconductor of claim 1, wherein the first and second transistors are n-channel type MOS transistors, and the third and fourth transistors are p-channel type MOS transistors.

3. The transconductor of claim 1, wherein the DC offset elimination circuit receives one or more input voltages from the transconductor circuit to generate a common current that is a function of the input voltages, and generates DC offset elimination voltage by combining the common current with a signal that is formed by amplifying a difference between the output voltage and the common mode voltage.

4. The transconductor of claim 3, wherein the DC offset elimination circuit includes a current generation circuit having a transistor and an amplifier to generate the common current, a common mode feedback circuit including two differential amplifiers, and a load circuit having a transistor functioning as a current mirror.

5. The transconductor of claim 1, wherein the first inversion amplifier includes a differential amplifier receiving voltages at symmetric both nodes of the transconductor circuit.

6. The transconductor of claim 1, wherein the first inversion amplifier receives the drain voltage of the first transistor so that the first transistor can operate in the triode region.

7. The transconductor of claim 5, wherein the first inversion amplifier includes: a first n-channel type MOS transistor operating in the triode region, a second n-channel type MOS transistor receiving a node voltage through the gate sharing the same node as that of the drain of the first n-channel type MOS transistor, a third n-channel type MOS transistor performing an inversion amplification by receiving a signal that is input into the source of the second n-channel type MOS transistor and common gate amplified through the gate of itself, and a fourth n-channel type MOS transistor receiving the inversion amplified signal through the gate and sharing the source with the node.

8. The transconductor of claim 1, wherein the second inversion amplifier includes an inversion feedback differential amplifier receiving the common mode control voltage to generate currents.

9. The transconductor of claim 7, wherein the inversion feedback differential amplifier includes a p-channel type MOS transistor receiving the common mode control voltage to generate the current, a fifth n-channel type MOS transistor receiving the drain voltage of the p-channel type MOS transistor and buffering the voltage from the gate to the source, and a sixth n-channel type MOS transistor differentially amplifying the voltage buffered by the fifth n-channel type MOS transistor and inputting the amplified voltage into the gate of the third transistor.

* * * * *